US007402993B2

(12) United States Patent
Morrison

(10) Patent No.: US 7,402,993 B2
(45) Date of Patent: Jul. 22, 2008

(54) ELECTRICAL PROFILE MONITORING SYSTEM FOR DETECTION OF ATYPICAL CONSUMPTION

(75) Inventor: Roger Morrison, Water Valley (CA)

(73) Assignee: Dtechs EPM Ltd., Calgary, Alberta (CA)

( * ) Notice: Subject to any disclaimer, the term of this patent is extended or adjusted under 35 U.S.C. 154(b) by 216 days.

(21) Appl. No.: 11/421,331

(22) Filed: May 31, 2006

(65) Prior Publication Data

US 2007/0200553 A1    Aug. 30, 2007

(30) Foreign Application Priority Data

Feb. 10, 2006    (CA)    .................................... 2535848

(51) Int. Cl.
*G01R 7/00*    (2006.01)
(52) U.S. Cl. ..................... 324/142; 340/870.02; 702/62
(58) Field of Classification Search .................. None
See application file for complete search history.

(56) References Cited

U.S. PATENT DOCUMENTS

| | | | |
|---|---|---|---|
| 4,120,031 A * | 10/1978 | Kincheloe et al. ........... 705/412 |
| 4,638,248 A | 1/1987 | Schweickert |
| 5,594,740 A | 1/1997 | LaDue |
| 6,262,672 B1 | 7/2001 | Brooksby et al. |
| 6,423,001 B1 | 7/2002 | Abreu |
| 6,424,820 B1 | 7/2002 | Burdick et al. |
| 6,671,635 B1 | 12/2003 | Forth et al. |
| 6,816,360 B2 | 11/2004 | Brooksby et al. |
| 6,947,854 B2 | 9/2005 | Swartztrauber et al. |
| 6,965,302 B2 | 11/2005 | Mollenkopf |
| 6,965,303 B2 | 11/2005 | Mollenkopf |
| 6,980,090 B2 | 12/2005 | Mollenkopf |
| 6,980,091 B2 | 12/2005 | White, II et al. |

FOREIGN PATENT DOCUMENTS

| | | |
|---|---|---|
| CA | 1049099 | 2/1979 |
| CA | 1314338 | 5/1985 |

(Continued)

OTHER PUBLICATIONS

"*Danny Lee Kyllo* versus *United States of America*, Brief for the United States", Supreme Court of the United States No. 99-8508, Dec. 2000, 42 pages.

(Continued)

*Primary Examiner*—Minh N Tang
(74) *Attorney, Agent, or Firm*—Sean W. Goodwin; Linda M. Thompson

(57) ABSTRACT

Methods of detecting atypical patterns of usage of electricity, determined by monitoring consumption at the primary line, permit detection of grow-ops and unusual line losses due to defective service lines. A meter having a high resolution is connected to the primary line and the data collected is compared to known consumption patterns thus identifying a potential theft or a loss. Once an atypical pattern has been found, the heat signatures of transformers fed by the primary line are measured. An unusual heat signature alerts the utility to load test the secondary lines of each residence fed from the transformer and thus locate suspect residences which may be grow-ops or to locate a line loss due to defective service lines.

35 Claims, 11 Drawing Sheets

FOREIGN PATENT DOCUMENTS

| | | |
|---|---|---|
| CA | 2076211 | 2/1993 |
| CA | 2165212 A1 | 6/1996 |
| CA | 2353929 A1 | 7/2000 |
| CA | 2502944 A1 | 5/2004 |

OTHER PUBLICATIONS

"Metering at the Transformer", Whitby Hydro Energy Services Corp., Feb. 3, 2005.

"Eliminating Residential Marijuana Grow Operations—An Alternate Approach", Surry Fire Department report, 2005.

"Is there a Clandestine Lab in your Neighbourhood?", Royal Canadian Mounted Police, Jan. 12, 2005.

"Thermal Imaging Concerns", web blog from the Gardener's Cure, http__www.hempcultivation.com__420__showthread.php__t=2034. pdf, accessed Jan. 9, 2006.

"Step 2000 Residential Surge Protection", Siemens, http://www.sea.siemens.com/step/pdfs/surge__1.pdf, accessed Feb. 7, 2000.

"Smart Meters", ieso, http://www.ieso.ca/imoweb/siteShared/smart__meters.asp?sid=ic, accessed May 25, 2006.

"Smart Meters", ENERGYiNTELLECT, http://www.energyintellect.com/html/meters.html, accessed May 25, 2006.

\* cited by examiner

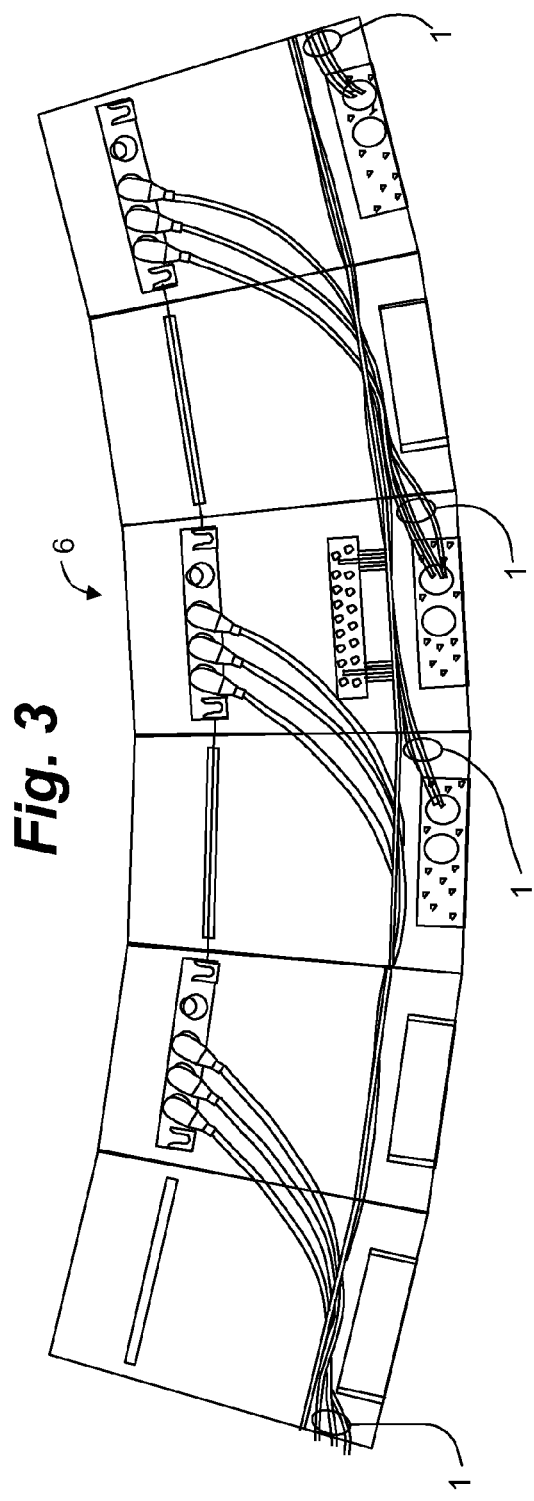
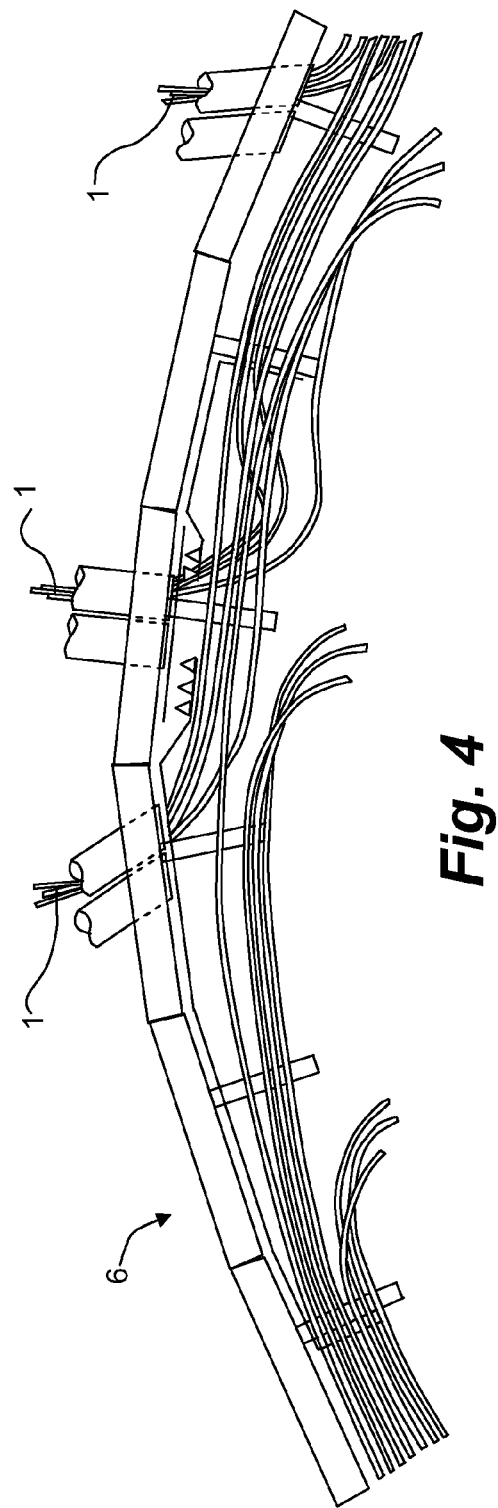
Fig. 3
Fig. 4

ELECTRICAL PROFILE MONITORING SYSTEM FOR DETECTION OF ATYPICAL CONSUMPTION

FIELD OF THE INVENTION

Embodiments of the invention relate to systems for monitoring usage of utilities, such as electrical, for alterations in normal patterns of consumption of utilities and, more specifically, to a system of detection of patterns indicative of theft of electrical utilities, such as in the indoor cultivation of marijuana.

BACKGROUND OF THE INVENTION

It is estimated that electrical theft alone results in millions of dollars of loss per year. Ontario, Canada reports an estimated cost of $500 million dollars per year. It is believed that the most significant contributor to electrical theft is the indoor cultivation of marijuana known as grow operations or "grow-ops". While recent case law has made the recovery of lost energy revenue possible, the reality is that very little monetary recovery is made through court actions.

Along with the staggering costs related to the electrical theft, there are additional costs to the community which include property damage, increased potential for fires due to wiring required to tap into the grid, electrical brown-outs and power outages due to blown transformers.

Typically, relatively new single family residential properties having underground power lines are targeted as sites for grow-ops. The electrical power lines are readily bypassed and are more suitable than older services to provide the sustained amperage, typically a 120 amp draw that is required for a large commercial operation. Older services typically provide only 60 amp or 100 amp overhead lines which are more susceptible to malfunction.

Monitoring of electrical services at a location in the service which would detect bypassing of conventional metering is uncommon. Applicant is unaware of systems currently in use which are capable of economically identifying atypical usage patterns at the primary level and thereafter pinpointing specific households which may be of interest to the utility providers and to law enforcement.

Systems are known to monitor consumption at secondary lines which feed electricity from the transformer to the residence which are capable of detecting over-usage, being typically in excess of a predetermined value, such as about 50% of the expected for a single household. Over-usage due to a grow operation or the like at the primary level however becomes more difficult to detect as the over-usage is typically not seen as a significant alteration in measurement using conventional metering.

There is great interest in systems which can be used to identify uncommon consumption patterns, at the primary level, which may be indicative of utility theft and which do not infringe upon existing laws which protect individual rights and freedoms.

BRIEF DESCRIPTION OF THE DRAWINGS

FIG. 3 is a rolled-out elevation schematic according to FIG. 2;

FIG. 4 is a rolled-out top view according to FIG. 2;

SUMMARY OF THE INVENTION

Embodiments of the invention provide a method of detecting atypical consumption patterns which when compared to known patterns of consumption are useful in identifying electrical losses or theft, such as by marijuana grow-ops. Use of a meter having a resolution capable of detecting suspect usage patterns on the primary line permits monitoring of consumption patterns without the need to access private property and which cannot be bypassed which is typically the case with individual residence metering and grow-ops.

Therefore in a broad aspect of the invention a method for detection of atypical electrical consumption patterns in an electrical system having a primary supply line supplying electricity to a plurality of transformers and wherein each transformer supplies electricity to a plurality of consumers through a plurality of secondary lines, comprises: metering the primary supply line at predetermined time intervals for establishing data indicative of patterns of consumption; comparing the patterns of consumption to known consumption patterns for identifying suspect consumption patterns, and when a suspect consumption pattern is identified, monitoring characteristics of the plurality of transformers for identifying a suspect transformer from the plurality of transformers; and load testing at least one of the plurality of secondary lines from the suspect transformer to each of the plurality of consumers.

In one embodiment the meter is a digital recording ammeter having a resolution of less than 1 amp and preferably from about 0.01 amp to about 0.1 amp.

In one embodiment, once the suspect consumption pattern has been identified at the primary line, the utility or other monitoring agency is notified and the responsible agency monitors the characteristics of the plurality of transformers.

Preferably, the characteristic monitored is the heat signature of the transformer which is typically measured using infrared laser technology such as with an infrared laser.

The suspect consumption pattern is compared to known consumption patterns from data collected over a period of time sufficient to avoid detecting only peak consumption levels. In one embodiment, a threshold consumption level is established, such as about 25% above peak consumption levels, to avoid falsely identifying peak consumption periods as being suspect.

DETAILED DESCRIPTION OF THE PREFERRED EMBODIMENT

Figure 1:
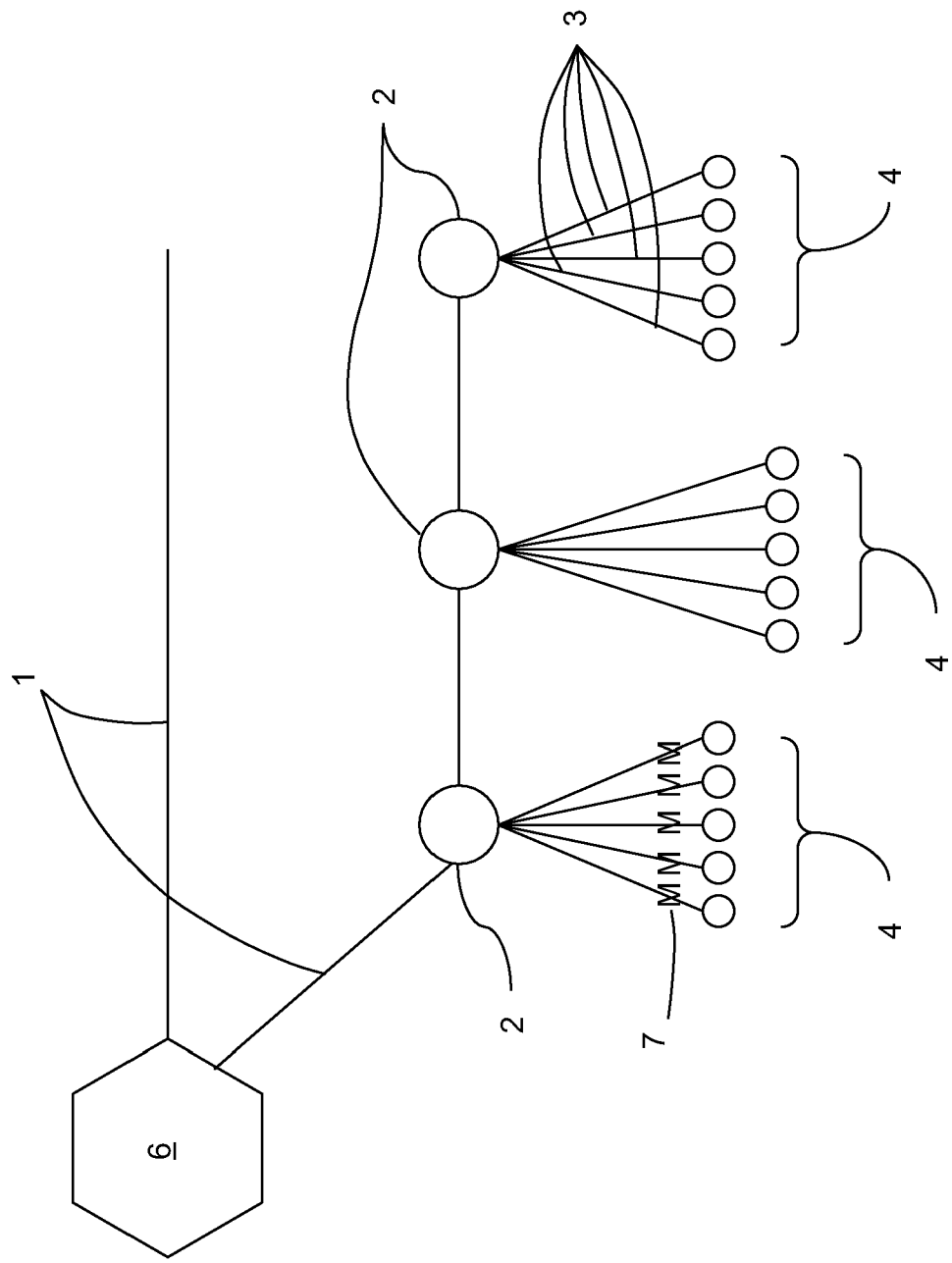
FIG. 1 illustrates a conventional electrical grid system which provides electricity to a plurality of residential properties.
Figure 2:
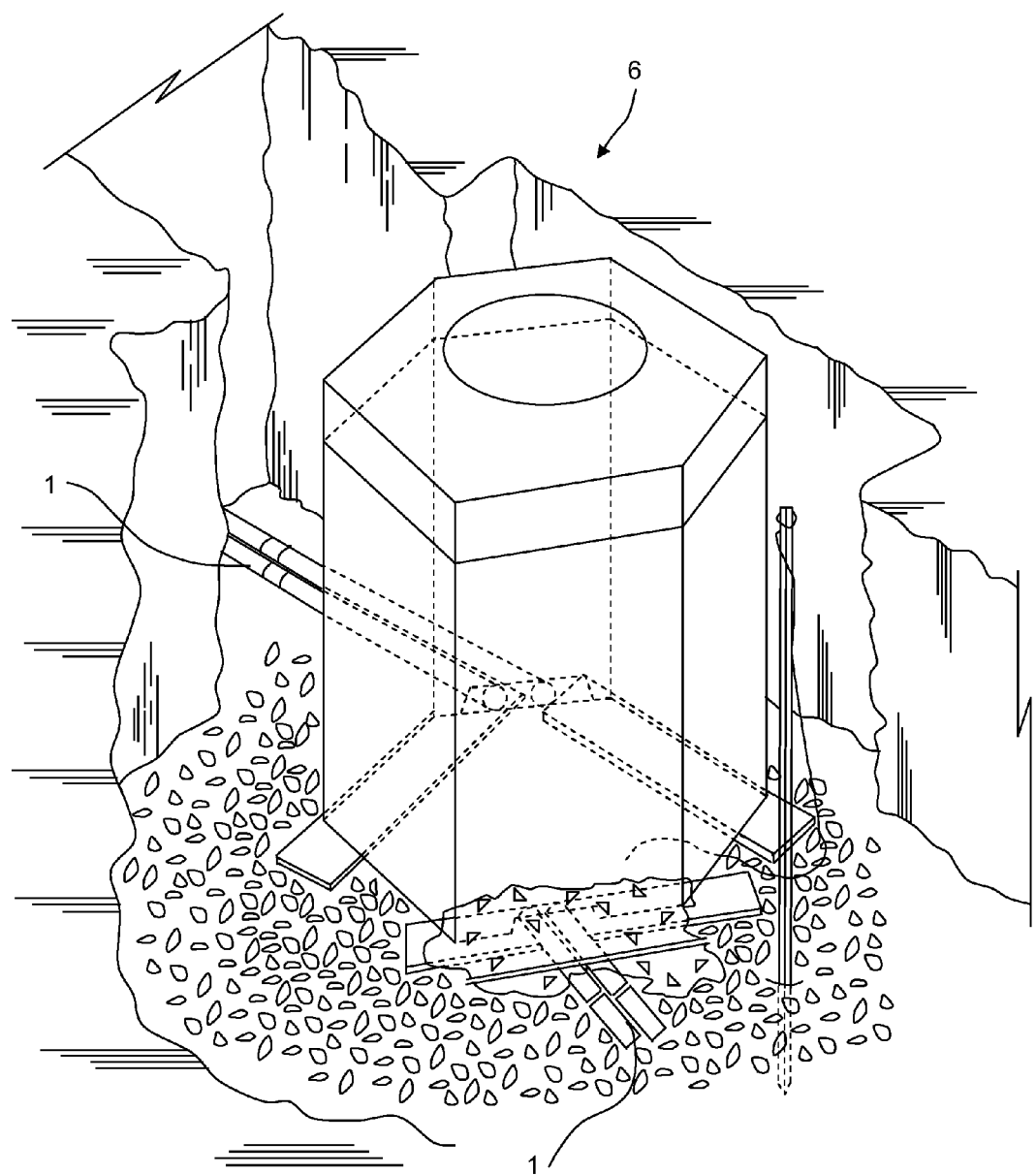
FIG. 2 is a perspective view of an underground electrical pull box which supplies electricity through a primary power line.
Figure 5:
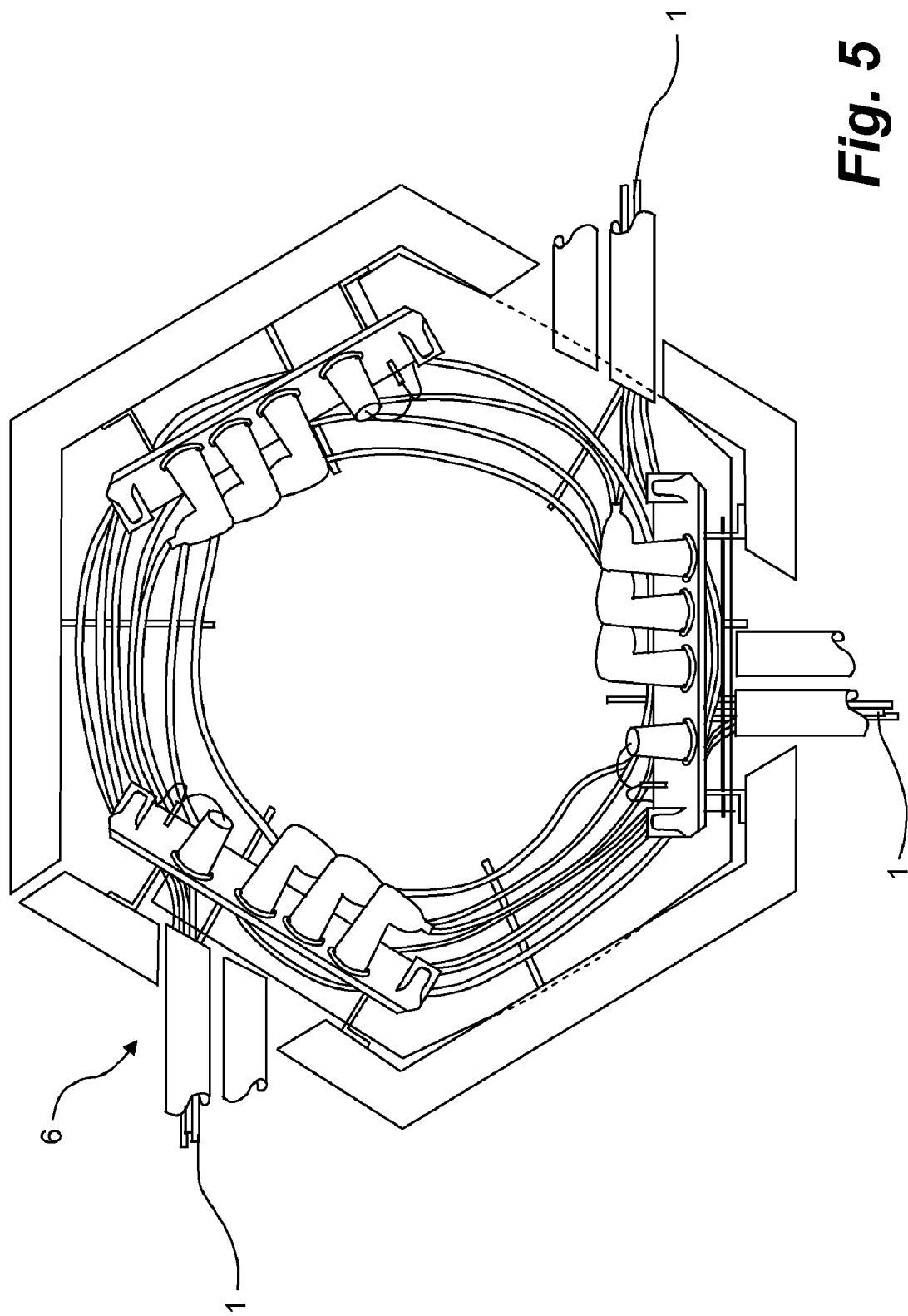
FIG. 5 is a top view according to FIG. 2.
Figure 6:
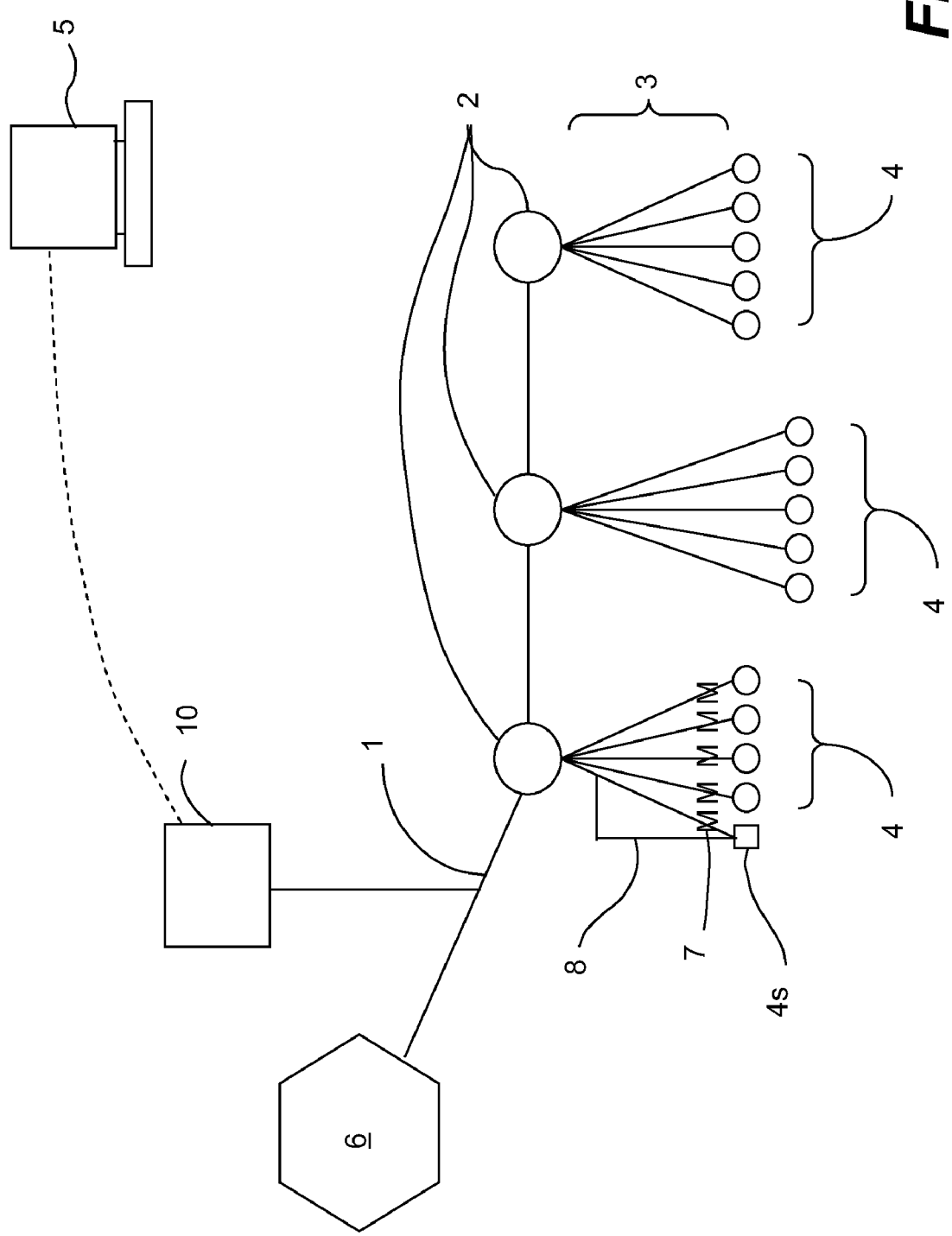
FIG. 6 is a schematic of a system according to an embodiment of the invention for monitoring consumption of electricity at the primary line.

As shown in FIG. 1, in residential electrical services, electricity is typically provided by a primary electrical line 1 extending from a pull box 6 and which provides power to a plurality of transformers 2 which in turn feed electricity through pairs of secondary lines 3 to each of a plurality of consumers 4, typically structures or residences, connected thereto. Consumption is typically measured at conventional meters 7 which are connected to the secondary lines 3 feeding each residence. Conventional meters 7 are readily bypassed 8 such for electrical theft (FIG. 6). In newer neighborhoods, the primary line 1 is an underground line which is connected from a source (not shown) to a plurality of underground pull boxes 6 which each feed a number of transformers 2. Typically, each pull box 6 might feed 8 to 10 separate transformers 2 which in turn each feed 8 to 12 residences 4. In older neighborhoods, the primary line 1 is an overhead line. For the purposes of the following description, embodiments of the invention are discussed in the context of an underground system. As one of skill would understand, the embodiments of the invention are also equally applicable to overhead services.

Having reference to FIGS. 1-5, each pull box 6 provides electricity to the plurality of transformers 2, which reduces the supplied voltage, typically from 13000V or 25000V down to 220V and each transformer 2 then provides electricity through the secondary lines 3 to the plurality of residential properties or structures 4. In a typical urban setting, each pull box 6 might service about 100 residential homes 4, with about 10 homes 4 connected to each of 10 transformers 2.

Figure 7A:
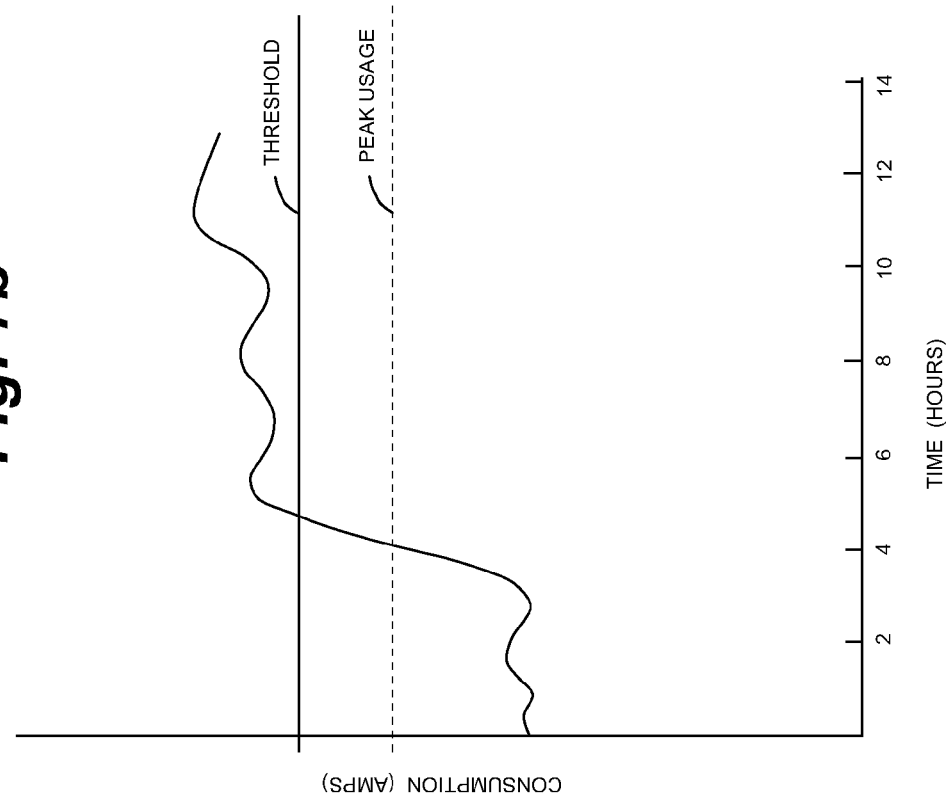
FIG. 7a is a graphical illustration of amperage results from a primary line meter without a grow operation.
Figure 7B:
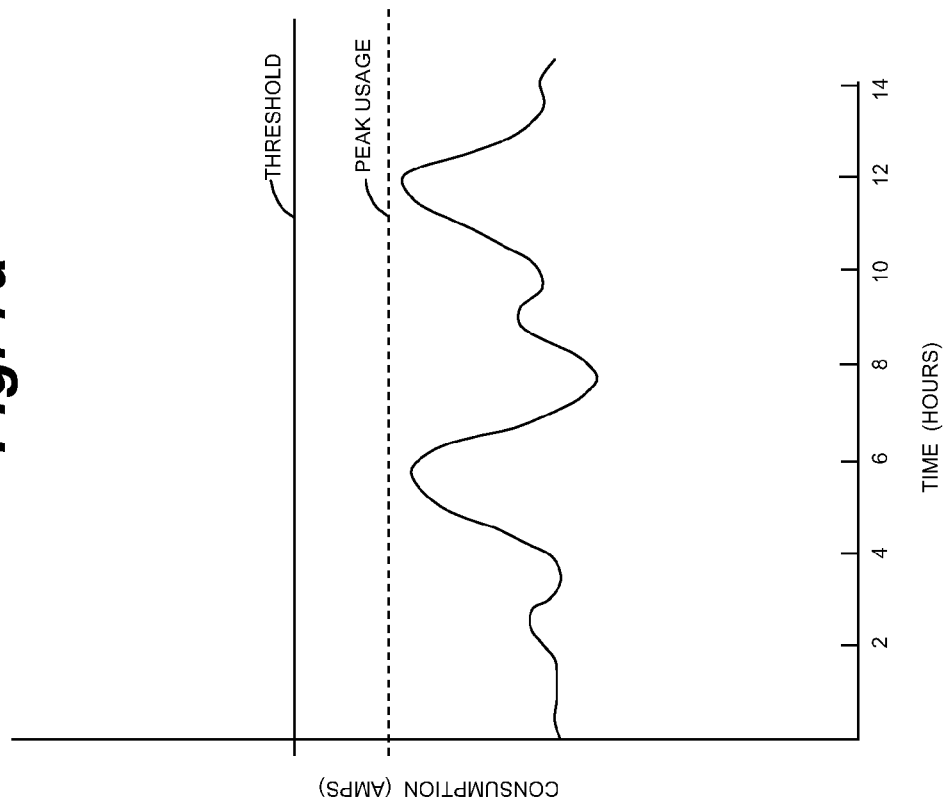
FIG. 7b a graphical illustration of amperage results from a primary line meter with a grow operation.
Figure 10:
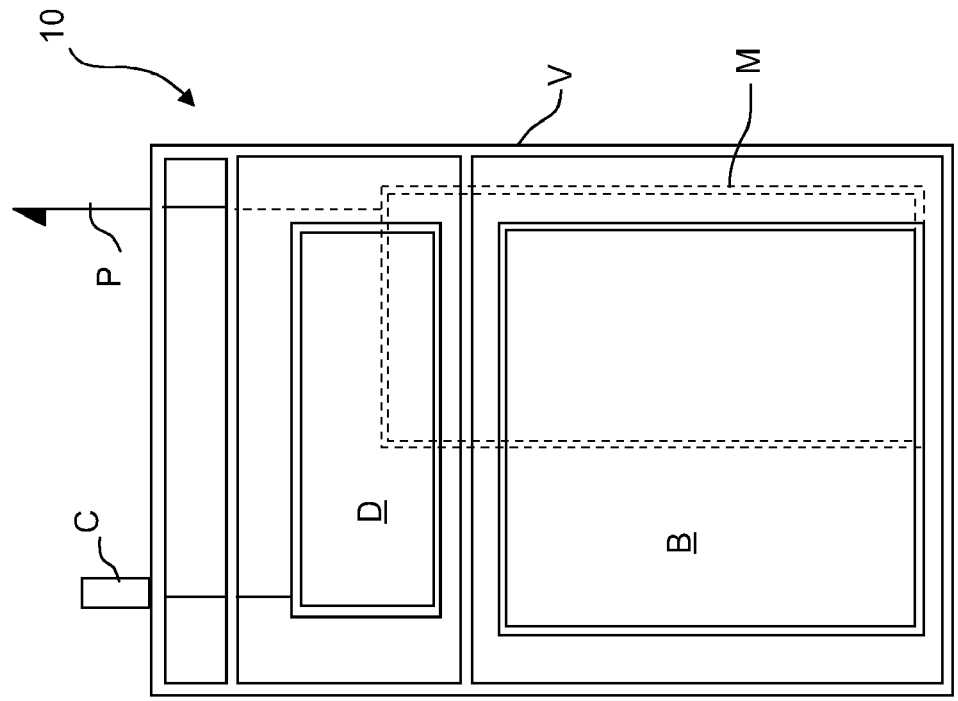
FIG. 10 is a schematic illustrating a meter suitable for measuring amperage in increments of about 0.1 amp to about 0.01 amp and transmitting said measurement via a digital modem to a central computer.
Figure 10:
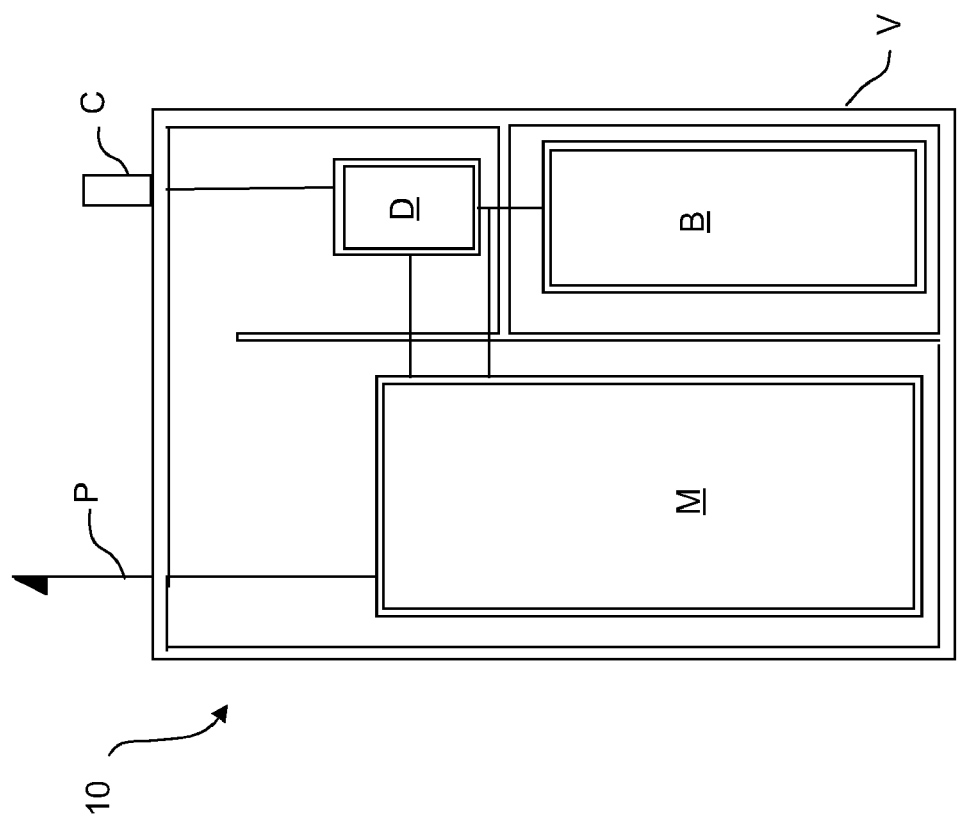

As shown in FIG. 6, in an embodiment of the invention, a system for detection of line losses or utility theft comprises a meter 10, such as shown in FIG. 10, connected to the primary electrical line 1 which feeds each transformer 2 connected thereto to monitor for fluctuations in consumption (FIGS. 7a and 7b) relative to a known mean or average consumption which has been determined for a particular area. Depending upon the type of transformer 2 and the voltage provided through the primary line 1, the average consumption can generally be predicted and can be verified using historical consumption records by the utility provider. Applicant is aware that an average consumption per household for a commonly used transformer 2 in Calgary, Alberta, Canada might be about 1-2 amps at 110 VAC when measured on one line or about 2-4 amps at 110 VAC when measured on both lines.

Preferably, the meter 10 provide data for determining measures indicative of electrical consumption, typically electrical consumption in amperage (amps) and, most preferably, has a resolution capable of measuring consumption at less than 1 amp increments. Preferably, the meter measures consumption in about 0.1 amp increments or even at higher resolutions of about 0.01 amp increments. Higher resolution monitoring assists in identifying aberrations in consumption at the primary level where small changes may result where a single grow-op is tied into the system.

In a preferred embodiment, as shown in FIG. 10, the meter 10 comprises a digital recording ammeter M enclosed in a water resistant PVC casing V which only actuates at predetermined time intervals, such as every 15 minutes, to take a reading and collects a number of interval readings over a predetermined time. Thus, a low-power battery system, such as a high capacity lithium battery B can be used. The meter 10 is connected to the primary line through a wire connection P. The collected data can be stored in the meter 10 for processing. Some processing can be performed on site or alternatively the data can be transmitted at predetermined intervals to a processor 5 for comparison to the known consumption patterns. The meter 10 is preferably equipped with a digital transmitter D such as a modem and a communication antenna C. The processor 5 can be a central computer, such as at the utility, and the transmission is by means such as wireless technology. Primary lines 1 which exhibit an increase in consumption which exceeds an established threshold over a specified period of time (FIG. 7b) are flagged as being of interest or suspect.

Figure 8:
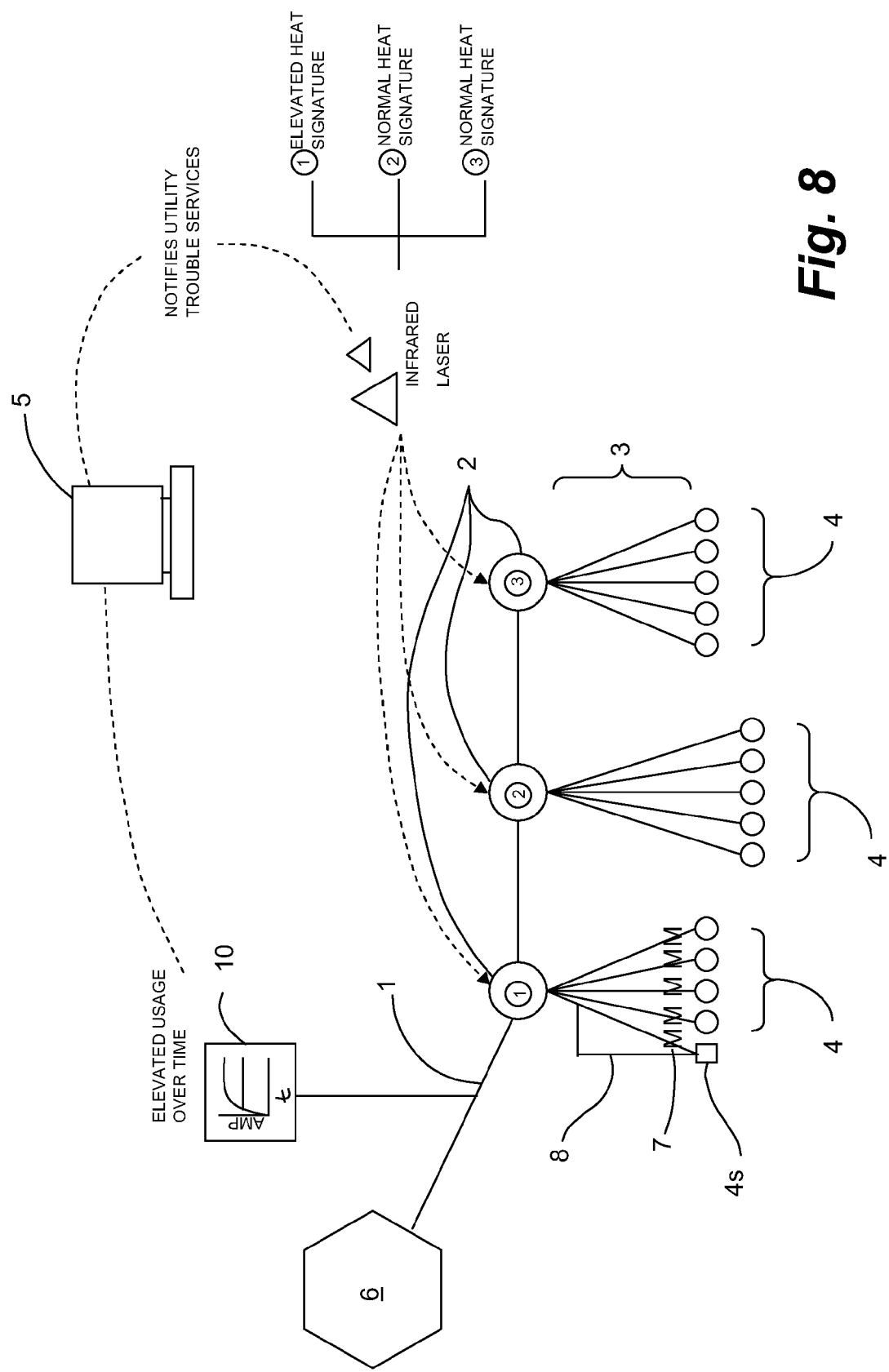
FIG. 8 is a schematic of the system according FIG. 5 comprising determination of heat patterns indicative of consumption of electricity at a plurality of transformers fed from the primary line and which, in turn, each feed a plurality of residences.

Having reference to FIG. 8, once a suspect consumption pattern has been identified at the primary line 1, characteristics, such as a heat signature, are monitored at all of the transformers 2 fed by the suspect primary line 1. In the case of heat signatures, infrared laser technology is typically used on all of the transformers 2 which are fed by the primary line 1 from the pull box 6 of interest. The transformers 2 are compared to other transformers 2 having a similar draw from the same primary line 1 and the transformer 2 which exhibits an excessive heat signature, indicating an unexpected draw, is flagged as being suspect. The infrared laser is thus capable of narrowing the number of residential properties or structures 4 of interest to only those which are fed by one or more suspect transformer(s) 2.

Figure 9:
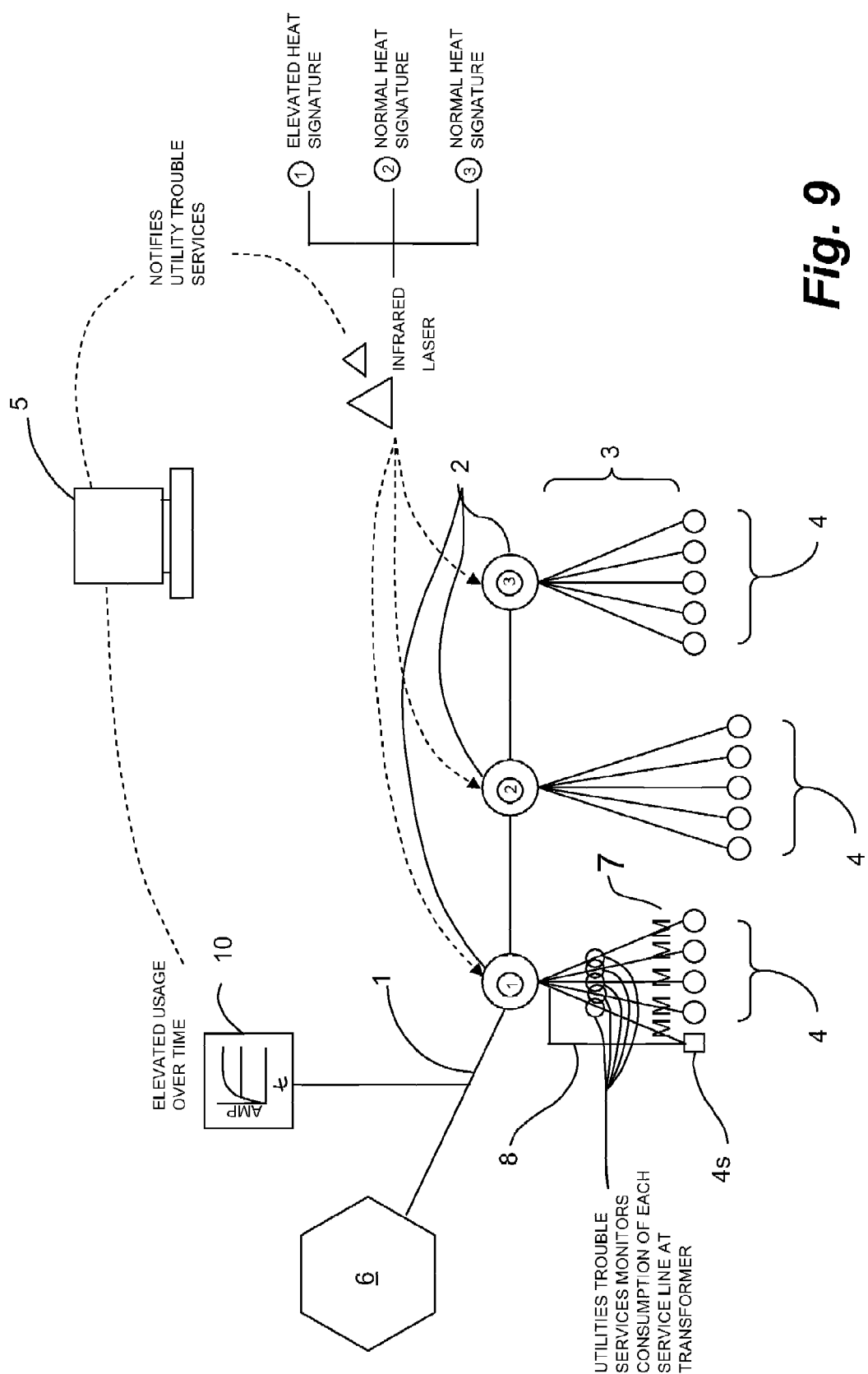
FIG. 9 is a schematic of the system according to FIGS. 5 and 6 further comprising identification of consumption patterns at each of a plurality of individual residences connected to each of the transformers to identify a residence of interest.

As shown in FIG. 9, having located a transformer 2 of interest, load testing is performed on the plurality of secondary service lines 3 within the transformer 2 to identify the suspect service or structure 4s. Once the suspect structure 4s is identified, appropriate action can be taken.

A further advantage of the system, as described above, is detection of power outages, which may occur for any reason, often unrelated to grow operations. Typically, utilities personnel are unaware of power outages unless notified by the affected individuals or as a result of random sweeps performed by Utility Trouble Services personnel who may notice an absence of street lights or the like. Interval monitoring of all primary lines quickly alerts the system to a complete drop in draw from a primary line consistent with a power outage.

An additional advantage of the system to the utility is the ability to accumulate usage data to reconcile with retailer usage data from metered sites. Further, line losses can be identified and rectified, where reconciliation data illustrates a loss which is not necessarily related to a grow-op.

New smart meter technology is rapidly being introduced to the industry to facilitate time-of-use metering at each residence, permitting utilities to charge for electrical usage dependent upon the time of use and for consumers to take advantage of times at which a lower cost is assessed to the use of electricity. The combination of smart metering at each residence and metering at the primary line, using a system according to embodiments of the invention disclosed herein, provides significant improvement in the collection of data for reconciliation and identification of losses, including the detection of line loss such as through faulty overhead or underground wires etc. Simply, the load provided at the primary line should be equal to the sum of all the consumptions measured at each residence, having consideration for known factors of line loss. A discrepancy signals a problem with some part of the line which can be located using the present invention or other means.

In Use

In use, as shown in FIGS. 6-9, embodiments of the invention are typically implemented by positioning a digital recording ammeter 10 on each primary line 1 in an electrical grid. This minimizes the number of meters 10 by about 10-fold over conventional transformer-based metering and 100-fold over residence by residence metering. The meter 10 is typically powered by a high capacity lithium battery and is programmed to actuate at specified intervals, such as every 15 minutes, to take a reading of the primary line amperage. Subsets of the ongoing data are stored at the meter 10 and after several readings are taken, such as readings collected over the period of an hour, the subset of data is transmitted, such as by a wireless technology to the centralized processor 5 or computer for comparison of the readings to predetermined thresholds for the primary line consumption. The meter 10 is located off property such as in a laneway in compliance with local, provincial and federal laws to avoid violation of the rights and privileges of the property owners.

The main computer system 5 analyzes and compares the amperage readings for each meter 10 and identifies primary lines 1 having unusually high draws. In a preferred embodiment of the invention, excessive draws from the primary line 1, which exceed a predetermined threshold over a predetermined period of time sufficient to eliminate spikes due to non-criminal activities, are flagged as suspect. The predetermined threshold is established through historical consumption records maintained by the utility and is set to accommodate normal peak high usage periods. Preferably the predetermined threshold is established having a buffer, such as about 25% over and above the peak high usage, to avoid incorrectly flagging high usage non-grow-op services. Further, typical expected consumption rates may also be predicted by experts taking into consideration the number and size of the residences 4, the type of transformer 2 and the voltage supplied by the primary line 1.

As shown in Table A, examples of hypothetical comparisons or ratios of amperage are made between average dwellings and grow operations where the primary line exiting the pull box 6 supplies 10 transformers, each of which in turn supply 100 residential dwellings. The results are illustrative of the type of increase expected.

TABLE A

|  | Residential Community | Total Residential Community | Total amps at primary line |
|---|---|---|---|
| Example 1 |  |  |  |
| Average draw over a predetermined period of time per dwelling | 2 amps | 200 amps | 5 amps |
| Average draw over a predetermined period of time per dwelling with a single grow operation | 100 amps | 300 amps | 7.5 amps |
| Percent increase |  |  | 50% |
| Example 2 |  |  |  |
| Average draw over a predetermined period of time per dwelling | 2 amps | 200 amps | 1.67 amps 3.15 amps |

TABLE A-continued

|  | Residential Community | Total Residential Community | Total amps at primary line |
|---|---|---|---|
| Average draw over a predetermined period of time per dwelling with a single grow operation | 100 amps | 300 amps | 2.50 amps 4.72 amps |
| Percent increase |  |  | 50% |

Once a primary line 1 has been identified as being suspect, notification is sent by the system 5 to a monitoring agency or the utility, such as to the Utility Trouble Services personnel, who are trained to monitor characteristics of the transformers, such as in the use of infrared laser technology and which typically carry such equipment for use in other routine servicing and monitoring functions. The Utility Trouble Services personnel perform an infrared laser scan of each transformer 2 connected to the suspect primary line 1. Measurements are often performed at night when temperature differences are greatest and the transformers 2 are not affected by sunlight. The laser is typically directed to approximately the same position on each transformer 2. The measurements can be performed without access to private property.

Should a transformer 2 have a heat signature which exceeds the typical heat signature, particularly when compared to other transformers 2 of the same type connected to the same primary line 1 or a primary line 1 having a similar supply voltage, the structures 4 connected thereto are further tested to identify a suspect structure 4s.

Load testing of the suspect transformer 2 having an excessive heat signature is also performed by the Utility Trouble Services personnel on each of the secondary service lines 3 within the transformer 2. Once a suspect residence 4s is identified, notification of the appropriate authorities and measures taken are governed by individual Utility provider policies and are beyond the scope of the embodiments described herein.

EXAMPLE 1

Following identification of a suspect primary line 1, heat signature comparisons of the transformers 2 were made using a 3M Scotchtrak Infrared IR-60L2 Series infrared laser, available from 3M Canada, London Ontario, Canada. The results are shown in Table B. The emissivity values of the unit was operated at 0.92 (unit preset) and 0.80 (value for steel) without appreciable difference. The comparisons were performed on a sunny day (not preferred) at 10:30 am at an ambient temperature of 8.4° C. (47.1° F.).

A digital recording ammeter placed on one of two incoming services lines from a suspect transformer 2 gave a reading of 31 amps over a predetermined period of time. Without load testing, a presumption was made that the amperage load for both lines was approximately double or 62 amps. Three additional transformers 2 in the grid of ten transformers 2 being fed from the primary line 1 were measured for comparison. The three additional transformers 2 were selected to have approximately the same sun exposure as the measurements were made during the day. Of note, all dwellings 4 in the residential area were of approximately the same size.

TABLE B

| Transformer | # of services | Heat reading (Celsius) | Heat reading (Fahrenheit) |
|---|---|---|---|
| Suspect | 7 | 13.5 | 56.3 |
| 1 | 10 | 9.4 | 48.9 |
| 2 | 7 | 9.3 | 48.7 |
| 3 | 4 | 9.2 | 48.6 |
| Margin from highest to second highest | | 4.1 | 7.4 |

EXAMPLE 2

Following identification of a suspect primary line 1, heat comparisons were made using the same equipment identified in the first example and are shown in Table C. The comparisons were performed at dawn at an ambient temperature of 8.9° C. (48.0° F.). Approximately three hours later, a load test was performed on both secondary lines 3 feeding into the now-identified grow operation. The results were 60.3 amps and 71.8 amps. Once inside the residence 4s, it was confirmed from the timers that the amperage readings at the time the heat comparisons were performed were the same as when the load testing was done. Seven additional transformers 2 in the grid of ten transformers 2 being fed from the primary line 1 were measured for comparison. Of note, all dwellings 4 in the residential area were of approximately the same size.

TABLE C

| Transformer | # of services | Heat reading (Celsius) | Heat reading (Fahrenheit) |
|---|---|---|---|
| Suspect | 10 | 16.8 | 62.2 |
| 1 | 9 | 10.6 | 51.1 |
| 2 | 10 | 10.5 | 50.9 |
| 3 | 11 | 10.6 | 51.1 |
| 4 | 11 | 10.5 | 50.9 |
| 5 | 11 | 10.5 | 50.9 |
| 6 | 9 | 8.5 | 47.3 |
| 7 | 8 | 8.9 | 48.0 |
| Margin from highest to second highest | | 6.2 | 11.1 |

EXAMPLE 3

Figure 11:
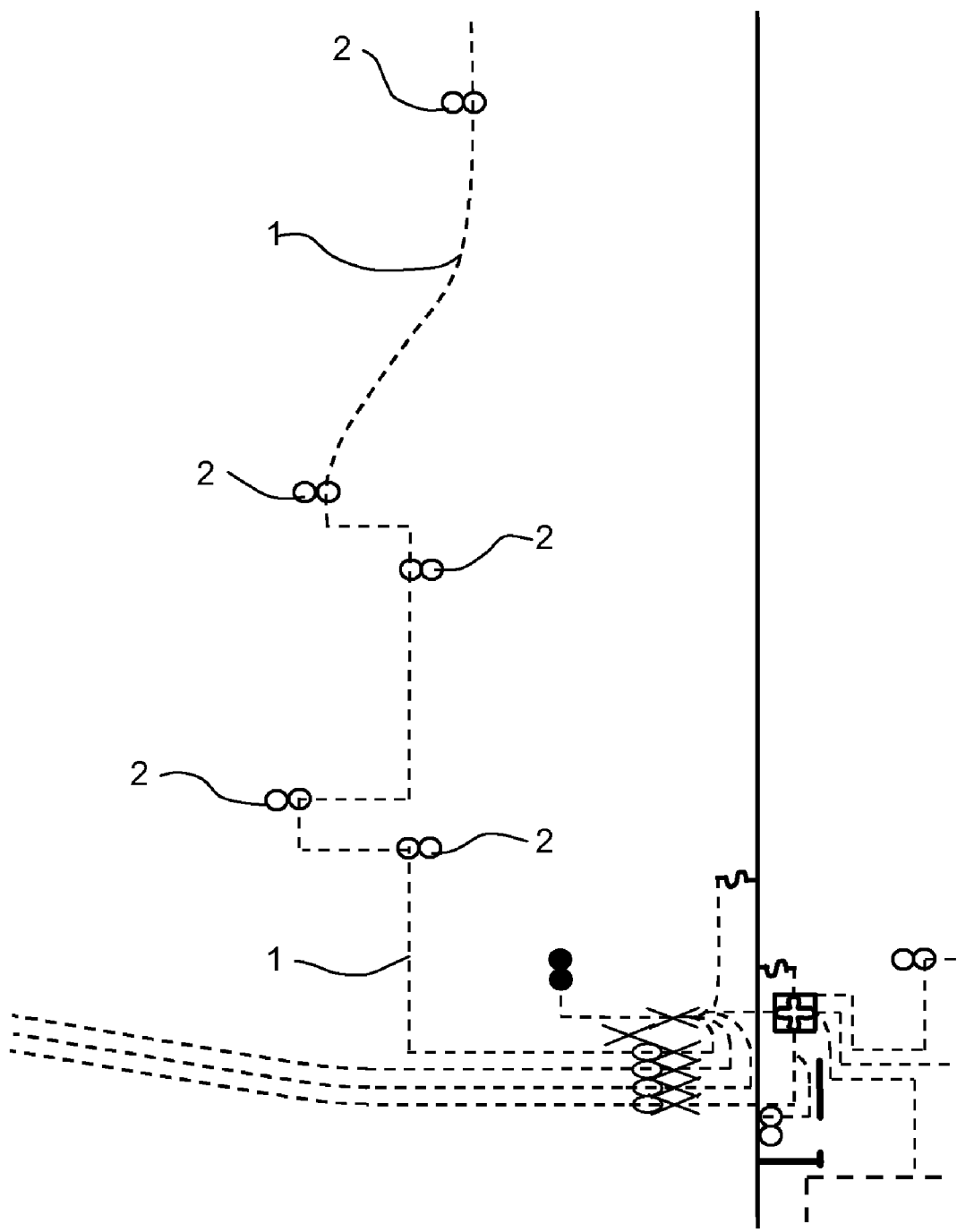
FIG. 11 is a schematic illustrating an electrical grid system for a specific residential community having 37 active residences monitored according to an embodiment of the invention as discussed in Example 3 herein for the existence of a grow-op.
Figure 12:
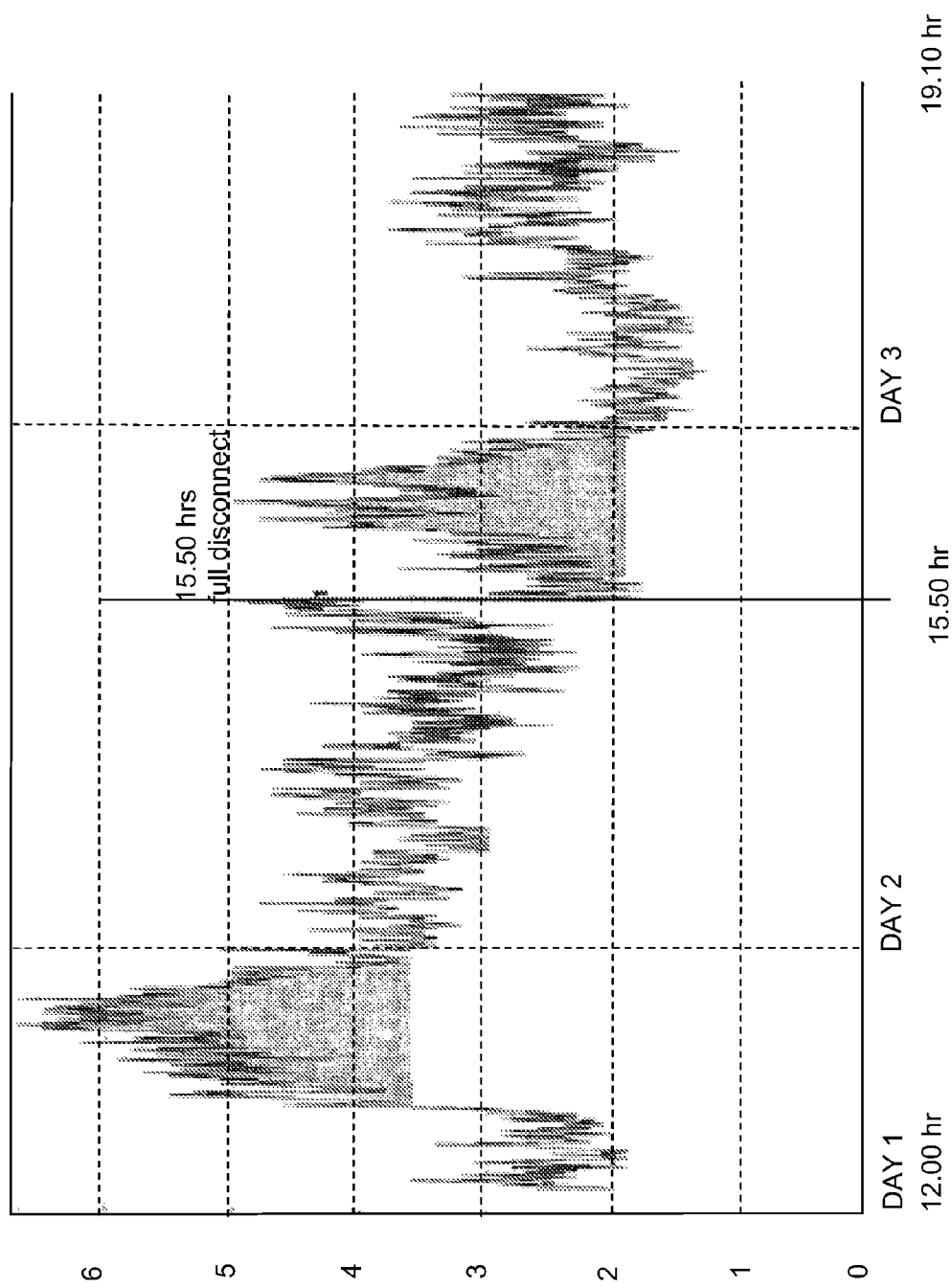
FIG. 12 is a graphical representation of digital recording ammeter output from a primary line according to Example 3 disclosed herein.

As shown in FIG. 11, a residential community having 37 active residences was monitored using an embodiment of the invention for the presence of a grow-op. A meter 10 was placed on the primary line 1 feeding transformers 2 (31W-3 to 31W-7). As shown in FIG. 12, a reading of 2.6 amps was initially obtained at 1315 hours on Day 1. Subsequently, an atypical consumption pattern was observed over a predetermined time period.

Heat signatures of the transformers 2 (31W-3 to 31W-7) were measured, as shown in Table D, and it was noted that one transformer 2 (31W-4) had a heat signature which exceeded that of the other transformers 2 fed by the primary line 1.

TABLE D

| Transformer | # of services | Heat reading (Celsius) | Heat reading (Fahrenheit) |
|---|---|---|---|
| 31W-7 | 6 | 8.7 | 47.7 |
| 31W-6 | 8 | 9.0 | 48.2 |
| 31W-5 | 8 | 8.8 | 47.8 |
| 31W-4 (suspect) | 8 | 12.9 | 55.2 |
| 31W-3 | 7 | 8.8 | 47.8 |
| Margin from highest to second highest | | 3.9 | 7.0 |

Subsequent load testing identified the suspect residence 4s which was entered on Day 2 at 1420 hours. An electrical bypass and 605 marijuana plants were found within the residence of which 160 were starter plants under 2 active fluorescent lights, 150 were maturing plants (12 hr) under 8 active 1000 watt lights, 150 were maturing plants (12 hr) under 8 inactive 1000 watt lights and 150 were vegetative plants (18 hr) under 6 inactive 1000 watt lights. Three 160 watt exhaust fans were also found.

The sensitivity of a meter, having a resolution capable of measuring amperage in 0.1 amp increments, connected to the primary line 1 was observed while load testing was performed under a variety of conditions at the pony panel in the residence. The results of the load testing are shown in Table E and can be compared to the primary line data shown in FIG. 12. It is clear that as the lights were activated, detection of the contribution from the grow-op was possible using the 0.1 amp meter. One of skill in the art would appreciate that at higher primary line voltages corresponding amperage would be lower and thus meters capable of measuring at greater resolution are required.

TABLE E

| Conditions | Time | Secondary Line 1 (amps) | Secondary Line 2 (amps) | Primary Line (Approx. - amps) |
|---|---|---|---|---|
| 8× 1000 watt lights active | 1500 | 33.8 | 44.6 | 3.0 |
| Testing at bypass for entire consumption | 1510 | 42.9 | 60.9 | 3.5 |
| All lights activated | 1526 | 97.7 | 109.6 | 5.0 |
| All lights activated | 1540 | 98.4 | 108.9 | 5.0 |
| All lights activated | 1548 | 97.5 | 105.9 | 5.0 |
| Blew fuse at pony panel | 1550 | — | — | 2.0 |

Having reference to FIG. 12, clear and distinct patterns of usage were established and correspond with traditional consumption patterns. For example one can note that the evening cycles are comparable however, the consumption on Day 2 is lower. Both were mid-week and the external temperature was comparable over the two day time period.

Clearly, once the marijuana grow-op electricity draw was terminated mid-day on Day 2, a substantial decrease (about a 1.5-2 amp drop) on the primary was observed. A 2 amp draw on the primary roughly equates to about a 240 amp draw on the secondary. Factoring in line efficiency of about 90%, the draw would theoretically be about 216 amps. The actual draw at the time the grow-op was terminated was about 203.4 amps.

Clearly, the data from the meter connected to the primary line correlates with the secondary power within the grid and illustrates that electrical usage patterns can be detailed from the primary line using a meter having at least a 0.1 amp resolution. One of skill in the art would understand that it is likely that a higher resolution meter would provide more detailed electrical use patterns and consumption details.

The embodiments of the invention in which an exclusive property or privilege is claimed are defined as follows:

1. A method for detection of atypical electrical consumption patterns comprising:
   providing a meter for detecting consumption of electricity from a utility;
   connecting the meter to a primary supply line, the primary supply line supplying electricity to a plurality of transformers, each transformer feeding the electricity to a plurality of structures, the meter having a resolution or detecting variation from known consumption patterns in the primary supply line;
   monitoring the primary supply line at predetermined time intervals for consumption of electricity;
   collecting data for determining measures indicative of patterns of consumption;
   comparing the patterns of consumption to known consumption patterns for identifying suspect consumption patterns; and
   when a suspect consumption pattern is identified,
   notifying the utility of the identified suspect consumption pattern in the primary line,
   the utility thereafter
   monitoring characteristics of the plurality of transformers for identifying a suspect transformer; and
   load testing at least one of a plurality of secondary lines from the suspect transformer to each of the plurality of structures for identifying a suspect structure.

2. The method of claim 1 further comprising physically inspecting the suspect structure for identifying a grow-op.

3. The method of claim 1 further comprising physically inspecting the suspect structure for identifying a line loss.

4. The method of claim 1 further having a smart meter connected to secondary lines at each structure for determining consumption at each of the structures, the method further comprising:
   comparing electrical supply at the primary supply line to a sum of the consumption at all of the secondary lines for reconciling consumption to supply.

5. The method of claim 1 wherein the characteristics of the plurality of transforms monitored is a heat signature.

6. The method of claim 5 wherein the heat signature is monitored using an infrared laser.

7. The method of claim 1 wherein the meter has a resolution or detecting electrical consumption in a range of less than 1 amp.

8. The method of claim 1 wherein the meter has a resolution or detecting electrical consumption in a range of about 0.01 to about 0.1 amp.

9. The method of claim 1 wherein the suspect consumption pattern is greater than a known consumption pattern over a predetermined period of time.

10. The method of claim 9 wherein the predetermined period of time is sufficient to eliminate normal peak usage as a suspect consumption pattern.

11. The method of claim 1 wherein the suspect consumption pattern is greater than a threshold consumption, the threshold consumption being greater than a known consumption so as to minimize false identification due to normal consumption patterns.

12. The method of claim 11 wherein the threshold consumption is about 25% greater than an average peak consumption.

13. The method of claim 1 wherein the meter is a digital recording ammeter.

14. The method of claim 13 wherein the digital recording ammeter has a resolution or detecting electrical consumption in a range of less than 1 amp.

15. The method of claim 13 wherein the digital recording ammeter has a resolution or detecting electrical consumption in a range of about 0.01 to about 0.1 amp.

16. The method of claim 13 wherein the digital recording ammeter is programmed to actuate at the predetermined time intervals for measuring electrical consumption.

17. The method of claim 13 wherein the digital recording ammeter further comprises a buffer for storage of data obtained at the predetermined intervals.

18. The method of claim 17 further comprising:
    processing the stored data for determining measures indicative of electrical consumption patterns; and
    transmitting the measures indicative of electrical consumption patterns to the utility.

19. The method of claim 17 further comprising:
    transmitting the stored data to a processor for determining measures indicative of electrical consumption patterns.

20. The method of claim 19 wherein the transmitting of stored data is by wireless technology.

21. A method for detection of atypical electrical consumption patterns in an electrical system having a primary supply line supplying electricity to a plurality of transformers and wherein each transformer supplies electricity to a plurality of consumers through a plurality of secondary lines, the method comprising:
    metering the primary supply line at predetermined time intervals for establishing data indicative of patterns of consumption;
    comparing the patterns of consumption to known consumption patterns for identifying suspect consumption patterns, and when a suspect consumption pattern is identified,
    monitoring characteristics of the plurality of transformers for identifying a suspect transformer from the plurality of transformers; and
    load testing at least one of the plurality of secondary lines from the suspect transformer to each of the plurality of consumers.

22. The method of claim 21 wherein the monitoring characteristics of the plurality of transformers further comprises:
    notifying a monitoring agency of the suspect consumption pattern in the primary line, wherein the monitoring agency then monitors the characteristics of the plurality of transformers.

23. The method of claim 21 wherein the load testing at least one of the plurality of secondary lines from the suspect transformer is for identifying a suspect consumer.

24. The method of claim 21 wherein the metering of the primary supply line is performed at a resolution or detecting variation from known consumption patterns in the primary supply line in response to suspect consumption patterns generated by the activities of a consumer.

25. The method of claim 21 wherein the characteristics of the plurality of transforms monitored is a heat signature.

26. The method of claim 25 wherein the heat signature is monitored using an infrared laser.

27. The method of claim 24 wherein the metering is performed at a resolution or detecting electrical consumption is a range of less than 1 amp.

28. The method of claim 24 wherein the metering is performed at a resolution or detecting electrical consumption in a range of about 0.01 to about 0.1 amp.

29. The method of claim 21 wherein the suspect consumption pattern is greater than a known consumption pattern over a predetermined period of time.

30. The method of claim 29 wherein the predetermined period of time is sufficient to eliminate normal peak usage as a suspect consumption pattern.

31. The method of claim 21 wherein the suspect consumption pattern is greater than a threshold consumption, the threshold consumption being greater than a known consumption so as to minimize false identification due to normal consumption patterns.

32. The method of claim 31 wherein the threshold consumption is about 25% greater than an average peak consumption.

33. The method of claim 21 wherein the metering is performed using a digital recording ammeter.

34. The method of claim 33 wherein the digital recording ammeter has a resolution or detecting electrical consumption in a range of less than 1 amp.

35. The method of claim 33 wherein the digital recording ammeter has a resolution or detecting electrical consumption in a range of about 0.01 to about 0.1 amp.

* * * * *